(12) United States Patent
Song

(10) Patent No.: US 7,629,826 B2
(45) Date of Patent: Dec. 8, 2009

(54) CIRCUIT FOR GENERATING PULSES FOR SEMICONDUCTOR MEMORY APPARATUS

(75) Inventor: Ho-Uk Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 48 days.

(21) Appl. No.: 11/643,822

(22) Filed: Dec. 22, 2006

(65) Prior Publication Data

US 2007/0262804 A1 Nov. 15, 2007

(30) Foreign Application Priority Data

May 9, 2006 (KR) ...................... 10-2006-0041620

(51) Int. Cl.
*G06F 1/04* (2006.01)
(52) U.S. Cl. .................. 327/291; 327/262; 327/299; 327/512
(58) Field of Classification Search ................. 327/291, 327/298, 299, 262–264, 512, 513
See application file for complete search history.

(56) References Cited

U.S. PATENT DOCUMENTS

| | | | | |
|---|---|---|---|---|
| 5,844,438 | A * | 12/1998 | Lee | 327/291 |
| 6,344,760 | B1 * | 2/2002 | Pyo | 327/51 |
| 6,700,365 | B2 * | 3/2004 | Isham et al. | 323/317 |
| 6,778,460 | B1 * | 8/2004 | Jung | 365/227 |
| 7,012,459 | B2 * | 3/2006 | Sutherland | 327/513 |
| 7,054,204 | B2 | 5/2006 | Lim et al. | |
| 7,085,185 | B2 | 8/2006 | Schröder et al. | |
| 7,250,799 | B2 * | 7/2007 | Son | 327/172 |
| 7,298,200 | B2 * | 11/2007 | Won | 327/541 |
| 2006/0104144 | A1 | 5/2006 | Byeon et al. | |
| 2008/0018371 | A1 * | 1/2008 | Suda et al. | 327/172 |

FOREIGN PATENT DOCUMENTS

| | | |
|---|---|---|
| JP | 2006 012404 | 1/2006 |
| KR | 1020030047013 | 6/2003 |
| KR | 1020030048291 | 6/2003 |
| KR | 1020050067520 | 7/2005 |

* cited by examiner

*Primary Examiner*—An T Luu
(74) *Attorney, Agent, or Firm*—Venable LLP; Jeffri A. Kaminski

(57) ABSTRACT

Disclosed is a circuit for generating pulses for a semiconductor apparatus. The circuit for generating pulses for a semiconductor apparatus includes a temperature sensor, a temperature signal decoder, and a pulse generator. The temperature sensor senses the temperature of a memory chip and converts the temperature into a digital code combination so as to output a plurality of temperature information signals. The temperature signal decoder decodes the plurality of temperature information signals so as to output a delay control signal. The pulse generator outputs an overdriving pulse signal in response to a sense amplifier driving signal and the delay control signal.

19 Claims, 5 Drawing Sheets

FIG. 3

| TEMP3 | TEMP2 | TEMP1 | TEMP |
|---|---|---|---|
| 0 | 0 | 0 | -40°C |
| 0 | 0 | 1 | -20°C |
| 0 | 1 | 0 | 0°C |
| 0 | 1 | 1 | 20°C |
| 1 | 0 | 0 | 40°C |
| 1 | 0 | 1 | 60°C |
| 1 | 1 | 0 | 80°C |
| 1 | 1 | 1 | 100°C |

CIRCUIT FOR GENERATING PULSES FOR SEMICONDUCTOR MEMORY APPARATUS

BACKGROUND OF THE INVENTION

1. Technical Field

The present invention relates to a circuit for generating pulses for a semiconductor memory apparatus and, more particularly, to a circuit for generating pulses for a semiconductor memory apparatus that outputs an overdriving pulse signal in response to a temperature variation.

2. Related Art

Referring to FIG. 1, a conventional circuit for generating pulses of a semiconductor memory apparatus includes a first inverter IV1, a delay unit 10, a NAND gate ND1 and a second inverter IV2.

The first inverter IV1 has an input terminal to which a sense amplifier driving signal SAEN is input. The delay unit 10 has an input terminal coupled to an output terminal of the first inverter IV1. The NAND gate ND1 has one input terminal coupled to an output terminal of the delay unit 10 and another input terminal receiving the sense amplifier driving signal SAEN. The second inverter IV2 has an input terminal coupled to an output terminal of the NAND gate ND1 and an output terminal outputting an overdriving pulse signal OVD_PUL.

As shown in FIG. 1, the sense amplifier driving signal SAEN is input to the first inverter IV1 and one input terminal of the NAND gate ND1. The sense amplifier driving signal SAEN input to the first inverter IV1 is inverted and then output to the delay unit 10. The delay unit 10 delays the inverted signal and outputs the delayed signal as an output signal to the NAND gate ND1. The NAND gate ND1 receives the sense amplifier driving signal SAEN and the output signal of the delay unit 10, generates a pulse signal having an active period corresponding to a delay time of the delay unit 10, and outputs the generated pulse signal to the second inverter IV2. The second inverter IV2 inverts the pulse signal and outputs the inverted pulse signal as the overdriving pulse signal OVD_PUL.

At a low temperature equal to or lower than 0° C., the threshold voltage of a transistor provided in a semiconductor memory apparatus rises and thus the tWR (write recovery time) characteristic of the semiconductor memory deteriorates rapidly. Since the above-mentioned general circuit for generating pulses for the semiconductor memory apparatus generates the overdriving pulse signal OVD_PUL having a fixed active period regardless of temperature, it is difficult to compensate for the deterioration of the tRW characteristic of the semiconductor memory apparatus at low temperatures. As a result, the operational performance of the semiconductor memory apparatus deteriorates.

SUMMARY OF THE INVENTION

Embodiments of the present invention provide a circuit for generating pulses for a semiconductor memory apparatus that can improve the tWR characteristic.

An embodiment of the present invention provides a pulse generating circuit for a semiconductor memory apparatus including a temperature sensor, a temperature signal decoder and a pulse generator. The temperature sensor senses the temperature of a memory chip and converts the temperature into a digital code combination so as to output a plurality of temperature information signals. The temperature signal decoder decodes the plurality of temperature information signals to output a delay control signal. The pulse generator outputs an overdriving pulse signal in response to a sense amplifier driving signal and the delay control signal.

Preferably, when the temperature of the memory chip is equal to or lower than a predetermined level, the delay control signal is activated such that an active period of the overdriving signal is extended.

BRIEF DESCRIPTION OF THE DRAWINGS

FIG. 3 is an exemplary truth table of N temperature information signals for the temperature of a memory chip output from a temperature sensor.

DESCRIPTION OF EXEMPLARY EMBODIMENT

Embodiments of the present invention will now be described in detail with reference to the accompanying drawings.

Figure 1:
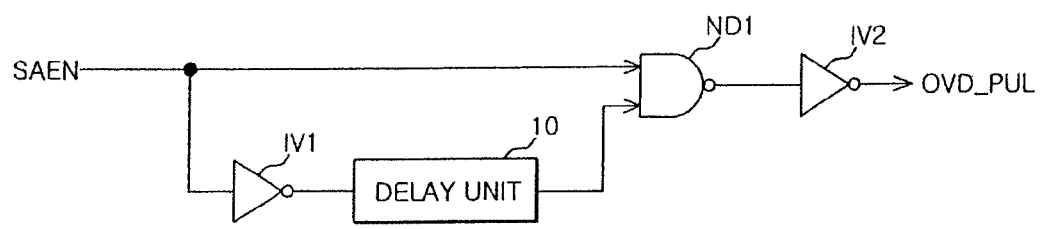
FIG. 1 is a circuit diagram of a general pulse generating circuit for a semiconductor memory apparatus according to the related art.
Figure 2:
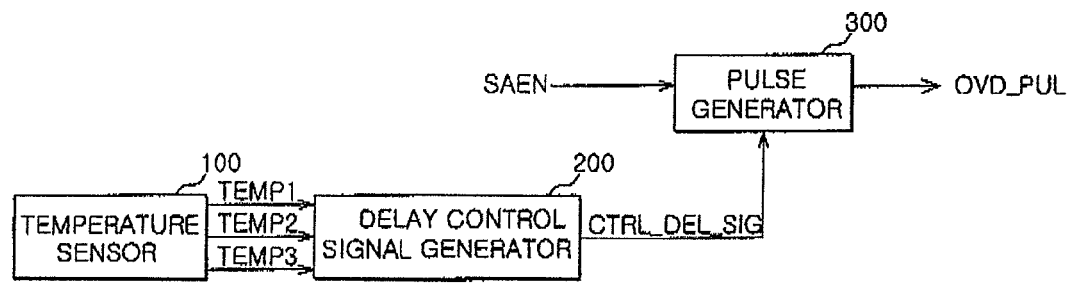
FIG. 2 is a block diagram of a pulse generating circuit for a semiconductor memory apparatus according to an embodiment of the present invention.

Referring to FIG. 2, the circuit for generating pulses for a semiconductor memory apparatus includes a temperature sensor 100, a delay control signal generator 200 and a pulse generator 300.

The temperature sensor 100 senses the temperature of a memory chip and converts the temperature into a N-bit digital code so as to output N temperature information signals, TEMP1-TEMPN. In an exemplary embodiment, the temperature sensor 100 converts the temperature of the memory chip into a 3-bit digital code combination and outputs three temperature information signals, TEMP1-TEMP3.

The delay control signal generator 200 decodes the N temperature information signals, TEMP1-TEMPN, so as to output a delay control signal CTRL_DEL_SIG.

The pulse generator 300 outputs an overdriving pulse signal OVD_PUL in response to a sense amplifier driving signal SAEN and the delay control signal CTRL_DEL_SIG. However, the present invention is not limited thereto. The signal input to the pulse generator 300 may be substituted for a signal having another function and thus it is possible to output a desired output.

FIG. 3 is an exemplary truth table of the N temperature information signals, TEMP1-TEMPN, for the temperature of the memory chip output from the temperature sensor. With respect to the exemplary embodiment of the invention, FIG. 3 depicts the three temperature information signals, TEMP1-TEMP3, which represent a first temperature information signal TEMP1, a second temperature information signal TEMP2, and a third temperature information signal TEMP3, each having one bit information, and thus the temperature TEMP of the memory chip can be expressed in 8 temperature ranges.

Figure 4:
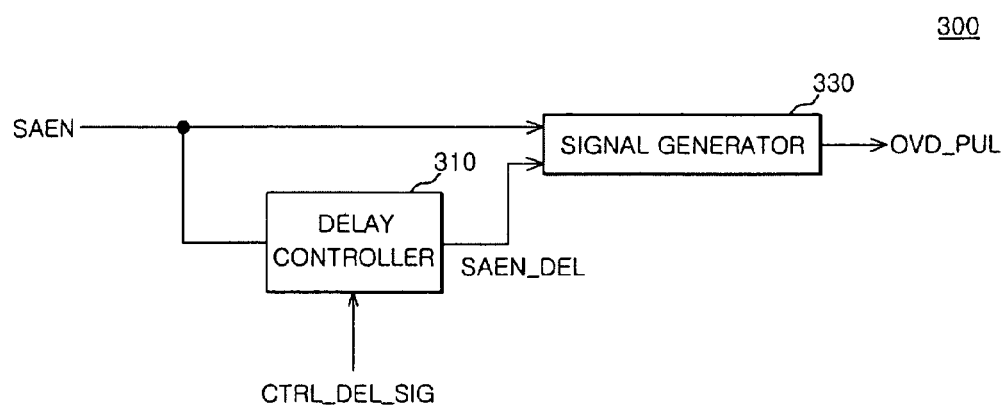
FIG. 4 is a block diagram of the pulse generator shown in FIG. 2.

FIG. 4 is a block diagram of the pulse generator shown in FIG. 2. Referring to FIG. 4, the pulse generator 300 includes a delay controller 310 and a signal generator 330.

The delay controller 310 controls the delay time of the sense amplifier driving signal SAEN in response to the delay control signal CTRL_DEL_SIG. The signal generator 330 receives the sense amplifier driving signal SAEN and a delayed sense amplifier driving signal SAEN_DEL output from the delay controller 310, and outputs the overdriving pulse signal OVD_PUL.

Figure 5:
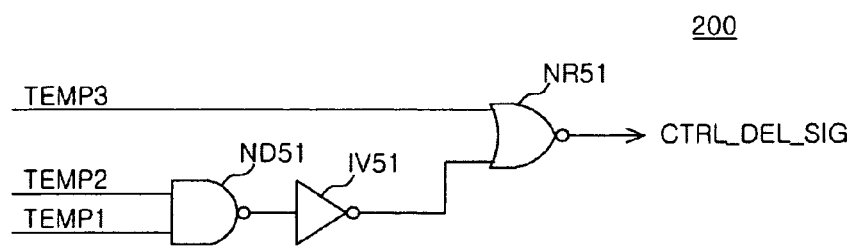
FIG. 5 is a circuit diagram of the temperature signal decoder shown in FIG. 2.

FIG. 5 is a circuit diagram of the temperature signal decoder shown in FIG. 2. Referring to FIG. 5, the delay control signal generator 200 includes a first NAND gate ND51, a first inverter IV51 and a first NOR gate NR51.

The first NAND gate ND51 has two input terminals to which the first temperature information signal TEMP1 and the second temperature information signal TEMP2 are input, respectively. The first inverter IV51 has an input terminal coupled to an output terminal of the first NAND gate ND51. The first NOR gate NR51 has one input terminal receiving the third temperature information signal TEMP3 and other input terminal coupled to an output terminal of the first inverter IV51, and an output terminal outputting the delay control signal CTRL_DEL_SIG.

As shown in FIGS. 3 and 5, the delay control signal generator 200 is configured such that the delay control signal CTRL_DEL_SIG is activated when the temperature of the memory chip is equal to or less than 0° C. (TEMP1=0, TEMP2=1, and TEMP3 =0). However, according to the intention of a designer, the delay control signal generator 200 may be configured such that the delay control signal CTRL_DEL_SIG is activated when the temperature of the memory chip is equal to or less than any predetermined temperature.

Figure 6:
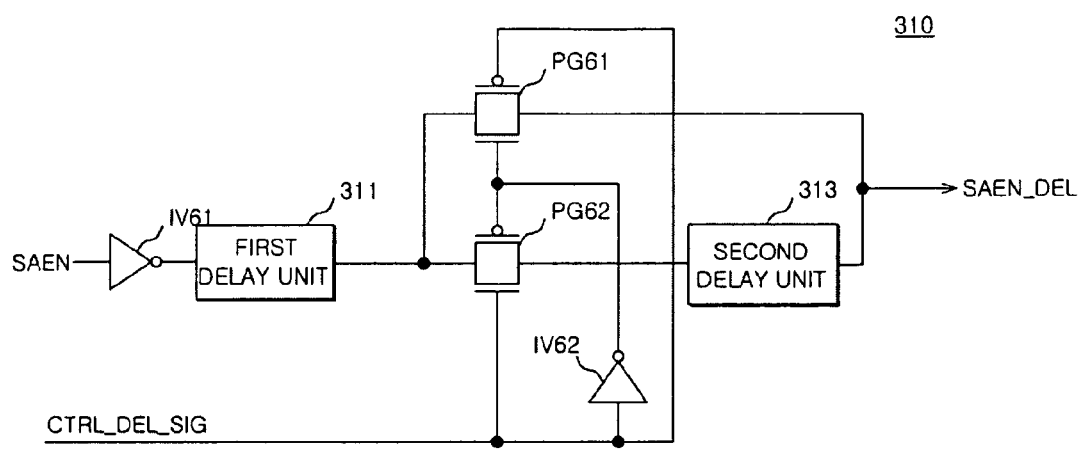
FIG. 6 is a circuit diagram of an example of the delay controller shown in FIG. 4.

FIG. 6 is a circuit diagram of an example of the delay controller shown in FIG. 4. Referring to FIG. 6, the delay controller 310 includes a second inverter IV61, a first delay unit 311, a first pass gate PG61, a second pass gate PG62, a third inverter IV62 and a second delay unit 313.

The second inverter IV61 has an input terminal to which the sense amplifier driving signal SAEN is input. The first delay unit 311 has an input terminal coupled to an output terminal of the second inverter IV61. The first pass gate PG61 has an input terminal coupled to an output terminal of the first delay unit 311 and is controlled in response to the delay control signal CTRL_DEL_SIG. The second pass gate PG62 has an input terminal connected to the output terminal of the first delay unit 311 and is controlled in response to the delay control signal CTRL_DEL_SIG. The second delay unit 313 has an input terminal coupled to an output terminal of the second pass gate PG62 and an output terminal coupled to an output terminal of the first pass gate PG61.

In the delay controller 310, the sense amplifier driving signal SAEN is inverted by the second inverter IV61 and then delayed and output by the first delay unit 311. Then, the output signal of the delay unit 311 may be output as the delayed sense amplifier driving signal SAEN_DEL through the first pass gate PG61 in response to the delay control signal CTRL_DEL_SIG. Also the output signal of the delay unit 311 may be further delayed by the second delay unit 313 through the second pass gate PG62 in response to the delay control signal CTRL_DEL_SIG, as the delayed sense amplifier driving signal SAEN_DEL.

Either the first pass gate PG61 or the second pass gate PG62 is activated in response to the delay control signal CTRL_DEL_SIG and an output signal of a third inverter IV62. The first pass gate PG61 and the second pass gate PG62 may be substituted for switching elements that respond to the delay control signal CTRL_DEL_SIG.

Figure 7:
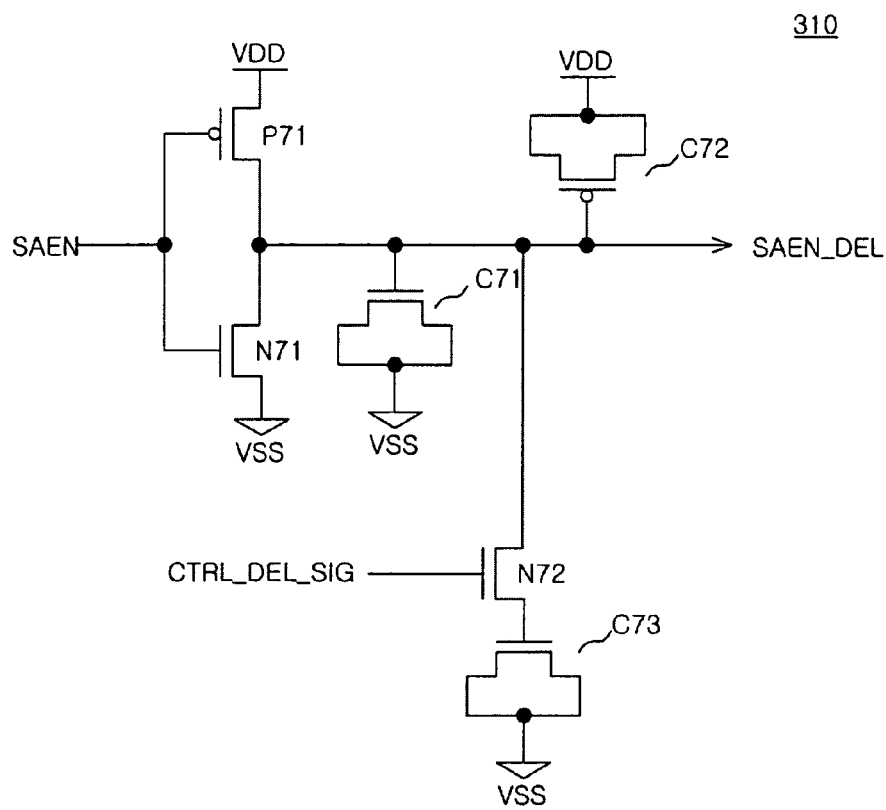
FIG. 7 is an alternate embodiment of the delay controller shown in FIG. 4.

FIG. 7 is an alternate embodiment of the delay controller shown in FIG. 4. As depicted in FIG. 7, the delay controller 310 may include a PMOS transistor P71, a first NMOS transistor N71, first capacitor C71, second capacitor C72, a second NMOS transistor N72 and a third capacitor C73.

The PMOS transistor P71 has a gate terminal to which the sense amplifier driving signal SAEN is input, a source terminal which is coupled to an external power supply VDD, and a drain terminal which is coupled to a common node. The first NMOS transistor N71 has a gate terminal to which the sense amplifier driving signal SAEN is input, a source terminal which is coupled to a ground terminal VSS, and a drain terminal which is coupled to the common node. The first and second capacitors C71 and C72 may be an NMOS transistor coupled between a source terminal and a drain terminal. The first and second capacitors C71 and C72 are coupled to the common node. The second NMOS transistor N72 has a gate terminal to which the delay control signal CTRL_DEL_SIG is input, a drain terminal which is coupled to the common node, and a source terminal which is coupled to the third capacitor C73. The third capacitor C73 may be also an NMOS transistor coupled between a source terminal and a drain terminal. In case, the third capacitor is the NMOS transistor, a gate terminal of the NMOS transistor for the third capacitor is coupled to the source terminal of the second NMOS transistor, and the common source-drain terminal is coupled to the ground terminal VSS.

Figure 8:
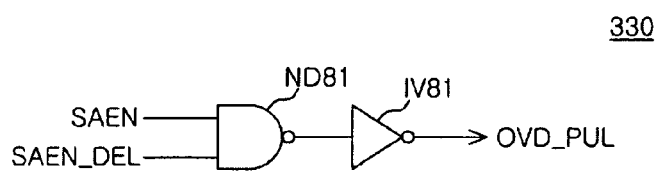
FIG. 8 is a circuit diagram of the signal generator shown in FIG. 4.

FIG. 8 is a circuit diagram of the signal generator shown in FIG. 4. Referring to FIG. 8, the signal generator 330 includes a second NAND gate ND81 and a fourth inverter IV81. The second NAND gate ND81 receives the sense amplifier driving signal SAEN and the delayed sense amplifier driving signal SAEN_DEL. The fourth inverter IV81 inverts an output signal of the second NAND gate ND81 and outputs the inverted signal.

In this embodiment of the present invention, the signal generator 330 is composed of logic elements to perform an AND operation. However, the present invention is not limited thereto.

The operation of a circuit for generating pulses for a semiconductor memory apparatus according to the embodiment of the present invention will now be described with reference to FIGS. 2 to 8.

The temperature sensor 100 senses the temperature TEMP of the memory chip, converts the temperature TEMP of the memory chip into digital code combinations, and outputs the 3-bit temperature information signals TEMP1, TEMP2, and TEMP3 forming the digital code combination, as shown in FIG. 3.

The delay control signal generator 200 logically combines the three temperature signals TEMP1, TEMP2, and TEMP3 to output the delay control signal CTRL_DEL_SIG which is activated when the temperature of the memory chip is equal to or lower than a predetermined temperature.

The pulse generator 300 receives the sense amplifier driving signal SAEN and controls the delay time of the sense amplifier driving signal SAEN in response to the delay control signal CTRL_DEL_SIG so as to output the overdriving pulse signal OVD_PUL, the active period of which varies according to the delay time of the sense amplifier driving signal SAEN.

More specifically, the temperature sensor 100 senses the temperature TEMP of the memory chip, generates 3-bit digital code combinations for temperature ranges as shown in FIG. 3, and outputs the individual bit values for one temperature range as the three temperature information signals TEMP1, TEMP2, and TEMP3.

The delay control signal generator 200 logically combines the temperature information signals TEMP1, TEMP2, and TEMP3 and outputs the activated delay control signal at a predetermined temperature or less. That is, when the temperature TEMP of the memory chip is 0° C. (TEMP1=0, TEMP2=1, and TEMP3 =0), −20° C. (TEMP1=1, TEMP2=0, and TEMP3=0), and −40° C. (TEMP1 =0, TEMP2=0, and TEMP3=0), the delay control signal generator 200 outputs the activated delay control signal CTRL_DEL_SIG at a high level, while in the other cases, the delay control signal generator 200 outputs the inactivated delay control signal CTRL_DEL_SIG at a low level.

The operation of the delay controller 310 in response to the delay control signal CTRL_DEL_SIG will now be described with reference to FIG. 6.

When the delay control signal CTRL_DEL_SIG is inactivated to a low level, the second pass gate PG62 is turned off and the first pass gate PG61 is turned on. Then, the sense amplifier driving signal SAEN is inverted by the second inverter IV61, is delayed by the first delay unit 311, and is output as the delayed sense amplifier driving signal SAEN_DEL.

Meanwhile, when the delay control signal CTRL_DEL_SIG is activated to a high level, the first pass gate PG61 is turned off and the second pass gate PG62 is turned on. Then, the sense amplifier driving signal SAEN is inverted by the second inverter IV61, is delayed by the first delay unit 311 and the second delay unit 313, and is output as the delayed sense amplifier driving signal SAEN_DEL.

The operation of the delay controller 310 in response to the delay control signal CTRL_DEL_SIG will now be described with reference to FIG. 7.

When the delay control signal CTRL_DEL_SIG is inactivated to a low level, the second NMOS transistor N72 is turned off. Then, the sense amplifier driving signal SAEN is inverted by the first NMOS transistor N71 and the first PMOS transistor P71 that combine to form an inverter, is delayed by the first capacitor C71 and the second capacitor C72, and is output as the delayed sense amplifier driving signal SAEN_DEL.

When the delay control signal CTRL_DEL_SIG is activated to a high level, the second NMOS transistor N72 is turned on. Then, the sense amplifier driving signal SAEN is inverted by the first NMOS transistor N71 and the first PMOS transistor P71 that combine to form an inverter, is delayed by the first capacitor C71, the second capacitor C72, and the third capacitor C73, and is output as the delayed sense amplifier driving signal SAEN_DEL.

As described with reference to FIGS. 6 and 7, the delay controller 310 delays the sense amplifier driving signal SAEN more when the delay control signal CTRL_DEL_SIG is activated to a high level than when the delay control signal CTRL_DEL_SIG is inactivated to a low level.

The signal generator 330 receives and logically operates the sense amplifier driving signal SAEN and the delayed sense amplifier driving signal SEAN_DEL output from the delay controller 310 and outputs the overdriving pulse signal OVD_PUL which is activated by the delay time of the sense amplifier driving signal SAEN.

As described above, in the embodiment of the present invention, when the temperature TEMP of the memory chip is equal to or lower than a predetermined temperature, the delay control signal generator 200 outputs the activated delay control signal CTRL_DEL_SIG, and the delay controller 310 controls the delay time of the sense amplifier driving signal SAEN in response to the delay control signal CTRL_DEL_SIG and outputs the delayed sense amplifier driving signal SAEN_DEL, thereby generating the overdriving pulse signal OVD_PUL having an active period corresponding to the delay time of the sense amplifier driving signal SAEN_DEL. Therefore, when the semiconductor memory apparatus performs an overdriving operation at low temperature, it is possible to supply the external power supply VDD for a longer time by the overdriving pulse signal OVD_PUL and thus to compensate for problems caused by an increase in the threshold voltage Vth at low temperature.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

The circuit for generating pulses for a semiconductor memory apparatus of embodiments of the present invention compensates for the increasing of the threshold voltage of the transistor at a low temperature equal to or lower than 0° C. As a result, the tWR characteristic is improved and thus the reliability of the semiconductor memory apparatus is improved.

What is claimed is:

1. A circuit for generating pulses for a semiconductor memory apparatus, comprising:
    a temperature sensor configured to sense a temperature of a memory chip, convert the sensed temperature into digital code signals, and to output the digital code signals as a plurality of temperature information signals;
    a delay control signal generator configured to output an activated delay control signal of one bit by detecting a predetermined temperature range in response to the plurality of temperature information signals; and
    a pulse generator configured to output an overdriving pulse signal in response to a sense amplifier driving signal and the delay control signal.

2. The circuit for generating pulses for a semiconductor memory apparatus of claim 1,
    wherein the digital code signals have a plurality of bits, and the plurality of temperature information signals have values of the bits, respectively.

3. The circuit for generating pulses for a semiconductor memory apparatus of claim 1,
    wherein the delay control signal generator activates the delay control signal when the temperature of the memory chip is equal to or lower than a predetermined temperature.

4. The circuit for generating pulses for a semiconductor memory apparatus of claim 1,
    wherein the pulse generator includes:
    a delay controller configured to control a delay time of the sense amplifier driving signal in response to the delay control signal to produce a delayed sense amplifier driving signal; and
    a signal generator configured to receive the sense amplifier driving signal and the delayed sense amplifier driving signal output from the delay controller and output the overdriving pulse signal.

5. The circuit for generating pulses for a semiconductor memory apparatus of claim 4, wherein the signal generator is configured to receive the sense amplifier driving signal and the delayed sense amplifier driving signal and perform an AND logic operation thereon.

6. The circuit for generating pulses for a semiconductor memory apparatus of claim 5,
wherein the signal generator includes:
a NAND gate configured to receive the sense amplifier driving signal and the delayed sense amplifier driving signal and to produce an output signal based thereon; and
an inverter configured to invert the output signal of the NAND gate.

7. The circuit for generating pulses for a semiconductor memory apparatus of claim 4,
wherein the delay controller is configured to selectively delay the sense amplifier driving signal by a first time period or a second time period in response to the delay control signal and output the delayed sense amplifier driving signal.

8. The circuit for generating pulses for a semiconductor memory apparatus of claim 7,
wherein the delay controller includes:
a first delay unit configured to delay the sense amplifier driving signal by the first time period to produce an output signal;
a second delay unit configured to delays the output signal of the first delay unit by a predetermined amount of time to produce an output signal; and
a switching unit configured to output any one of the output signal of the first delay unit and the output signal of the second delay unit as the delayed sense amplifier driving signal in response to the delay control signal.

9. The circuit for generating pulses for a semiconductor memory apparatus of claim 8,
wherein the second time period is a time period obtained by adding the predetermined amount of time to the first time period.

10. The circuit for generating pulses for a semiconductor memory apparatus of claim 9,
wherein the switching unit includes a first switching element and a second switching element responding to the delay controller.

11. The circuit for generating pulses for a semiconductor memory apparatus of claim 10,
wherein the first switching element and the second switching element are pass gates that respond to the delay control signal.

12. The circuit for generating pulses for a semiconductor memory apparatus of claim 7,
wherein the delay controller includes:
a first inverter that has an input terminal receiving the sense amplifier driving signal and an output terminal;
a first delay unit that has an input terminal connected to the output terminal of the first inverter and an output terminal;
a first switching element that responds to the delay control signal and has an input terminal connected to the output terminal of the first delay unit and an output terminal;
a second switching element that responds to the delay control signal and has an input terminal connected to the output terminal of the first delay unit and an output terminal; and
a second delay unit that has an input terminal connected to the output terminal of the second switching element and an output terminal connected to the output terminal of the first switching element.

13. The circuit for generating pulses for a semiconductor memory apparatus of claim 12,
wherein the first switching element and the second switching element are pass gates.

14. The circuit for generating pulses for a semiconductor memory apparatus of claim 7,
wherein the delay controller includes:
an inverter configured to invert and output the sense amplifier driving signal and having an output terminal;
a first capacitor and a second capacitor that are connected to the output terminal of the inverter;
a transistor that has a gate terminal receiving the delay control signal, a drain terminal connected to the output terminal of the inverter and a source terminal; and
a third capacitor that is connected between the source terminal of the transistor and a ground terminal.

15. The circuit for generating pulses for a semiconductor memory apparatus of claim 14,
wherein the sense amplifier driving signal is delayed by the first capacitor and the second capacitor to be output as the delayed sense amplifier driving signal, or is delayed by the first capacitor, the second capacitor, and the third capacitor to be output as the delayed sense amplifier driving signal.

16. A circuit for generating pulses for a semiconductor memory apparatus, comprising:
a temperature sensor configured to sense a temperature of a memory chip, convert the sensed temperature into a digital code signals, and to output the digital code signals as a plurality of temperature information signals;
a delay control signal generator configured to output an activated delay control signal of one bit by a detecting predetermined temperature range in response to the plurality of temperature information signals; and
a pulse generator configured to output an overdriving pulse signal in response to a sense amplifier driving signal and the delay control signal,
wherein the delay control signal generator activates the delay control signal when the temperature of the memory chip is equal to or lower than a predetermined temperature.

17. The circuit for generating pulses for a semiconductor memory apparatus of claim 16,
wherein the digital code signals have a plurality of bits, and the plurality of temperature information signals have values of the bits, respectively.

18. The circuit for generating pulses for a semiconductor memory apparatus of claim 16,
wherein the pulse generator includes:
a delay controller configured to control a delay time of the sense amplifier driving signal in response to the delay control signal to produce a delayed sense amplifier driving signal; and
a signal generator configured to receive the sense amplifier driving signal and the delayed sense amplifier driving signal output from the delay controller and output the overdriving pulse signal.

19. The circuit for generating pulses for a semiconductor memory apparatus of claim 18,
wherein the delay controller includes:
a first delay unit configured to delay the sense amplifier driving signal by a first time period to produce an output signal;

a second delay unit configured to delays the output signal of the first delay unit by a predetermined amount of time to produce an output signal; and a switching unit configured to output any one of the output signal of the first delay unit and the output signal of the second delay unit as the delayed sense amplifier driving signal in response to the delay control signal.

* * * * *